United States Patent
He et al.

(10) Patent No.: US 10,170,425 B2
(45) Date of Patent: Jan. 1, 2019

(54) MICROSTRUCTURE OF METAL INTERCONNECT LAYER

(71) Applicant: International Business Machines Corporation, Armonk, NY (US)

(72) Inventors: Hong He, Schenectady, NY (US); Juntao Li, Cohoes, NY (US); Junli Wang, Singerlands, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 86 days.

(21) Appl. No.: 14/538,978

(22) Filed: Nov. 12, 2014

(65) Prior Publication Data

US 2016/0133573 A1    May 12, 2016

(51) Int. Cl.
  *H01L 21/44* (2006.01)
  *H01L 21/20* (2006.01)
  (Continued)

(52) U.S. Cl.
  CPC .. *H01L 23/53238* (2013.01); *H01L 21/76883* (2013.01); *H01L 2924/0002* (2013.01)

(58) Field of Classification Search
  CPC ......... H01L 2924/0002; H01L 2924/00; H01L 23/53238; H01L 2924/00014; H01L 2224/05647; H01L 23/5226; H01L 21/76843; H01L 21/76879; H01L 23/5256; H01L 23/528; H01L 23/53266; H01L 21/76846
  (Continued)

(56) References Cited

U.S. PATENT DOCUMENTS 6,030,895 A      2/2000  Joshi et al.
6,043,153 A  *   3/2000  Nogami ............ H01L 21/76877
                                                       257/E21.584
(Continued)

OTHER PUBLICATIONS

Deutscher et al., "Origin of Superconductive Glassy State and Extrinsic Critical Currents in High-Tc Oxides", Physical Review Letters, vol. 59, No. 15, Oct. 12, 1987, pp. 1745-1747.
(Continued)

*Primary Examiner* — Duy T Nguyen
(74) *Attorney, Agent, or Firm* — Cantor Colburn LLP; Vazken Alexanian

(57) ABSTRACT

A metal interconnect layer, a method of forming the metal interconnect layer, a method of forming a device that includes the metal interconnect layer are described. The method of forming the metal interconnect layer includes forming an opening in a dielectric layer, forming a metal layer in the opening and over a top surface of the dielectric layer. The method also includes disposing a metal passivation layer on an overburden portion of the metal layer formed over the top surface of the dielectric layer. The metal passivation layer includes a metal selected from a group of: cobalt (Co), ruthenium (Ru), tantalum (Ta), titanium (Ti), nickel (Ni), tungsten (W), any alloy thereof, nitrides of Co, Ru, Ti, Ni, or W, and any combination thereof. The method also includes performing an anneal at a temperature exceeding 100 degrees centigrade and below 300 degrees centigrade.

11 Claims, 6 Drawing Sheets

(51) Int. Cl.
  *H01L 23/532* (2006.01)
  *H01L 21/768* (2006.01)
(58) Field of Classification Search
  USPC ......... 257/750, 751, 529, E23.149; 438/132, 438/584, 600
  See application file for complete search history.

(56) References Cited

U.S. PATENT DOCUMENTS

| | | | | |
|---|---|---|---|---|
| 6,235,406 B1 * | 5/2001 | Uzoh | ................ | H01L 21/2885 205/157 |
| 6,479,389 B1 * | 11/2002 | Tsai | ................ | H01L 21/76877 257/E21.585 |
| 6,727,172 B1 * | 4/2004 | Jong | ................ | H01L 21/7684 257/E21.583 |
| 7,208,404 B2 | 4/2007 | Tsao et al. | | |
| 7,338,908 B1 | 3/2008 | Koos et al. | | |
| 7,732,922 B2 | 6/2010 | Yang et al. | | |
| 8,525,339 B2 | 9/2013 | Yang et al. | | |
| 2001/0042897 A1 * | 11/2001 | Yeh | ................ | H01L 23/5256 257/529 |
| 2002/0076925 A1 * | 6/2002 | Marieb | ................ | H01L 21/76843 438/678 |
| 2002/0192938 A1 * | 12/2002 | Wada | ................ | H01L 21/2855 438/618 |
| 2005/0161817 A1 * | 7/2005 | Meyer | ................ | H01L 21/76838 257/751 |
| 2011/0124192 A1 * | 5/2011 | Ganguli | ................ | C23C 16/18 438/653 |
| 2012/0269987 A1 * | 10/2012 | Dordi | ................ | H01L 21/0206 427/539 |
| 2013/0119509 A1 | 5/2013 | Farooq et al. | | |
| 2013/0252417 A1 * | 9/2013 | Ishizaka | ................ | C23C 14/025 438/643 |

OTHER PUBLICATIONS

Lu et al., "Nanostructured surface layer on metallic materials induced by surface mechanical attrition treatment", Materials Science and Engineering A, vols. 175-377, 2004, pp. 38-45.

Yang et al., "Effects of Metal Capping on Thermal Annealing of Copper Interconnects", IEEE Electron Device Letters, vol. 33, No. 7, Jul. 2012, pp. 1051-1053.

Zhang et al., "Do Twin Boundaries Always Strengthen Metal Nanowires?", Nanoscale Research Letters, vol. 4, No. 1, 2009, pp. 34-38.

* cited by examiner

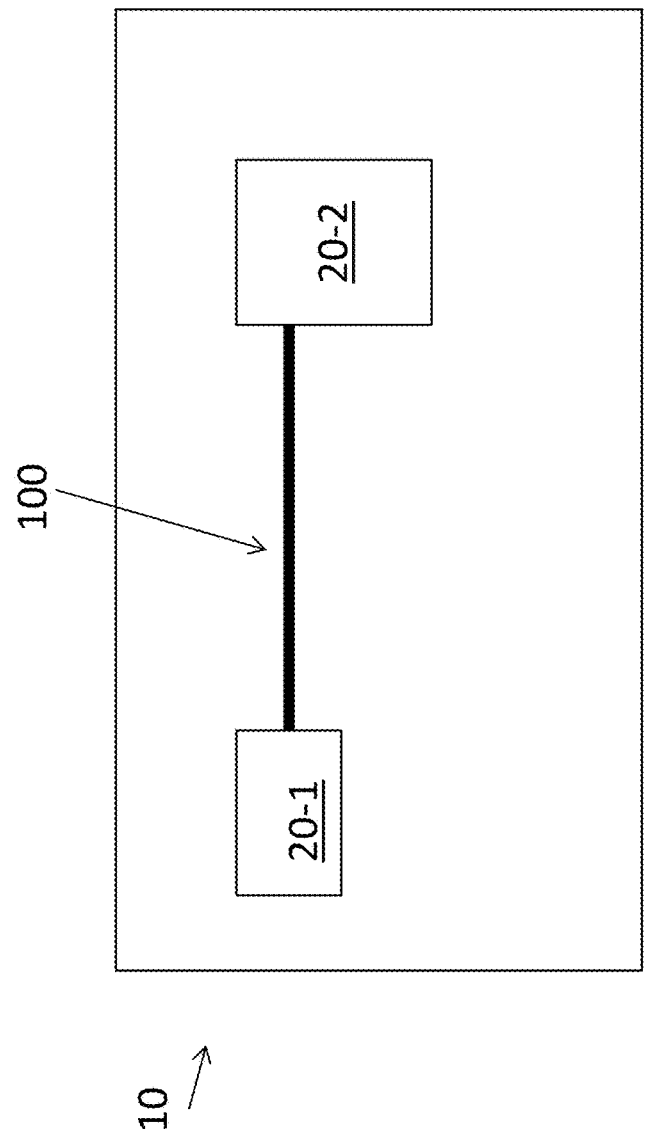

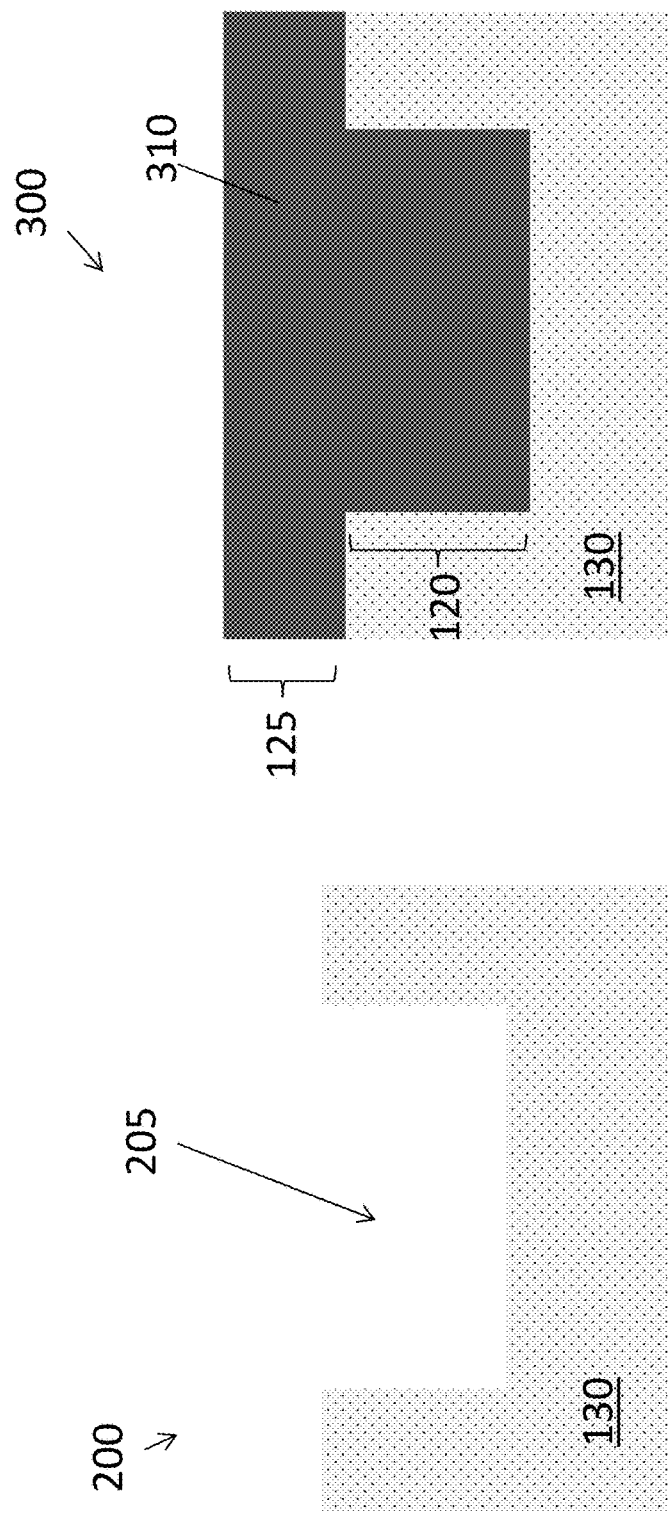

MICROSTRUCTURE OF METAL INTERCONNECT LAYER

BACKGROUND

The present invention relates to a metal interconnect, and, more specifically, to the microstructure of the metal interconnect layer.

The performance of a metal interconnect is affected by the microstructure. Microstructure, in turn, is affected by the anneal temperature. Increased anneal temperature in processing the metal interconnect layer leads to increased grain size, and increased grain size results in improved performance. That is, a grain boundary may be regarded as a defect in the grain that reduces electrical conductivity. Thus, the ideal metal interconnect microstructure is a single grain rather than a polycrystalline structure. In comparison to other grain boundaries, twin boundaries between grains are desirable for their increased mechanical strength and electrical conductivity. A polycrystalline structure in a metal interconnect layer typically contains less than 10% twin boundaries. Further, while elevated anneal temperatures are desirable for achieving large grains, the conventional annealing conditions for copper (Cu) back-end-of-line (BEOL) processing are 100° C. This is due to the coefficient of thermal expansion mismatch between Cu and its surrounding dielectric which leads to residual stress induced by the anneal process that can result in manufacturing and reliability concerns.

SUMMARY

According to one embodiment of the present invention, a method of forming a metal interconnect layer includes forming an opening in a dielectric layer; forming an embedded metal layer in the opening; forming an overburden layer over a top surface of the embedded metal layer and the dielectric layer; disposing a metal passivation layer on a surface of the overburden layer, the metal passivation layer comprising a metal selected from a group of: cobalt (Co), ruthenium (Ru), tantalum (Ta), titanium (Ti), nickel (Ni), tungsten (W), any alloy thereof, nitrides of Co, Ru, Ti, Ni, or W, and any combination thereof; and performing an anneal at a temperature exceeding 100 degrees centigrade and below 300 degrees centigrade.

According to another embodiment, a method of forming a device that includes a metal interconnect layer includes disposing a metal passivation layer on an overburden region of a metal layer disposed in and above a dielectric layer, the metal passivation layer comprising a metal selected from a group of: cobalt (Co), ruthenium (Ru), tantalum (Ta), titanium (Ti), nickel (Ni), tungsten (W), any alloy thereof, nitrides of Co, Ru, Ti, Ni, or W, and any combination thereof; performing an anneal at a temperature exceeding 100 degrees centigrade and below 300 degrees centigrade; performing a chemical-mechanical planarization (CMP) to remove the metal passivation layer and the overburden region of the metal layer; and interconnecting two components of the device with the metal interconnect layer based on disposing each of the two components at opposite ends of the metal interconnect layer.

According to yet another embodiment, a metal interconnect layer includes a dielectric; and a metal portion over the dielectric, the metal portion including grain boundaries, wherein over half of the grain boundaries are twin boundaries.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 1 is an exemplary device that includes a metal interconnect layer according to an embodiment of the invention;

FIG. 2 is a cross sectional view of a structure at one stage in the formation of the metal interconnect layer according to embodiments of the invention;

FIG. 3 is a cross sectional view of a structure at another stage in the formation of the metal interconnect layer according to embodiments of the invention;

DETAILED DESCRIPTION

Figure 4:
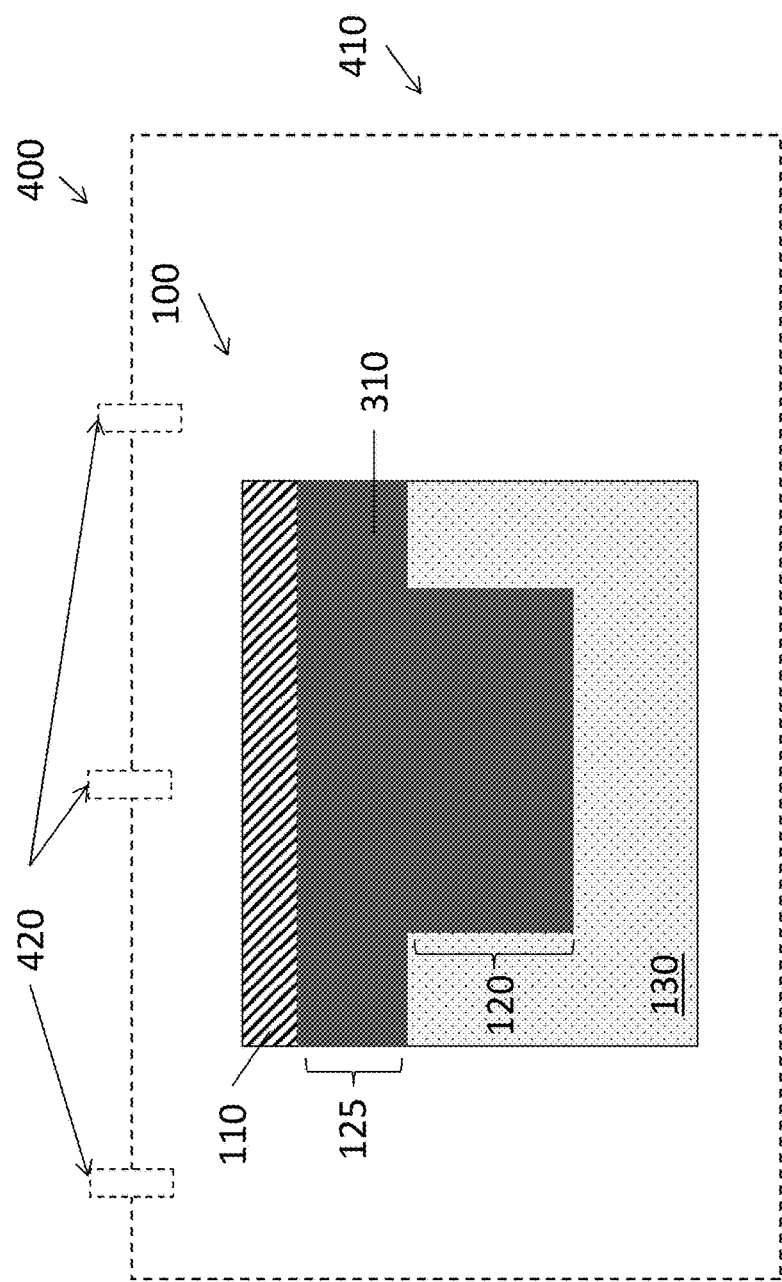
FIG. 4 is a cross sectional view of a structure at another stage in the formation of the metal interconnect layer according to embodiments of the invention.

As noted above, increased grain size in the metal interconnect layer results in better performance of the metal interconnect. This better performance refers to higher electrical conductivity as well as increased mechanical strength. Increased anneal temperature results in increased grain size, but simply increasing anneal temperature of the prior metal interconnect layer results in the formation of voids above 100 degrees Celsius (° C.), for example. This is because, during thermal anneal, a higher compressive stress ($\sigma$) in the patterned metal (e.g., copper (Cu)) region, as compared with the overburden or free surface region above it, results in a stress gradient that causes voids to develop in the patterned region due to the transport of the Cu, for example, into the overburden region. A prior approach considers a tantalum nitride (TaN) passivation layer that facilitates an anneal temperature of 300° C. or higher. This approach results in prevention of delamination and void formation within patterned interconnects and grain boundaries greater than 10% of the grain boundaries (but still below 50%) being twin boundaries. Embodiments of the structure and process discussed herein are not limited to patterned interconnects and employ metal passivation layers other than TaN. Embodiments of the metal interconnects resulting from the combination of using one of these passivation layers and controlling the anneal temperature and gas flow rate during anneal include microstructures with over 50% twin boundaries 610 (FIG. 6) such that electrical conductivity and mechanical strength are both increased.

FIG. 1 is an exemplary device 10 that includes a metal interconnect layer 100 according to an embodiment of the invention. The scale of the metal interconnect layer 100 according to embodiments discussed herein is not limited. Thus, the device 10 may be, for example, an integrated circuit with components 20 that are interconnected by the metal interconnect layer 100 having a width on the scale of nanometers. Alternatively, the device 10 may relate to televisions or to the automobile industry such that the metal interconnect layer 100 width is on the scale of microns or centimeters. According to additional embodiments, even higher dimensions are possible for the metal interconnect layer 100. Although only one pair of components 20-1, 20-2 and one metal interconnect layer 100 are shown in FIG. 1, the device 10 may have any number of components 20 and metal interconnect layers 100 that carry electricity between them.

FIGS. 2-5 illustrate stages in the processing of the metal interconnect layer 100 according to embodiments of the invention. FIG. 2 is a cross sectional view of a structure at one stage 200 in the formation of the metal interconnect layer 100 according to embodiments of the invention. As shown in FIG. 2, an opening 205 is formed in a dielectric layer 130. FIG. 3 is a cross sectional view of a structure at another stage 300 in the formation of the metal interconnect layer 100 according to embodiments of the invention. Metal 310 is added in the opening 205 of the dielectric layer 130 as an imbedded metal region 120 and also above the dielectric layer 130 and embedded metal region 120 as an overburden region 125.

Figure 5:
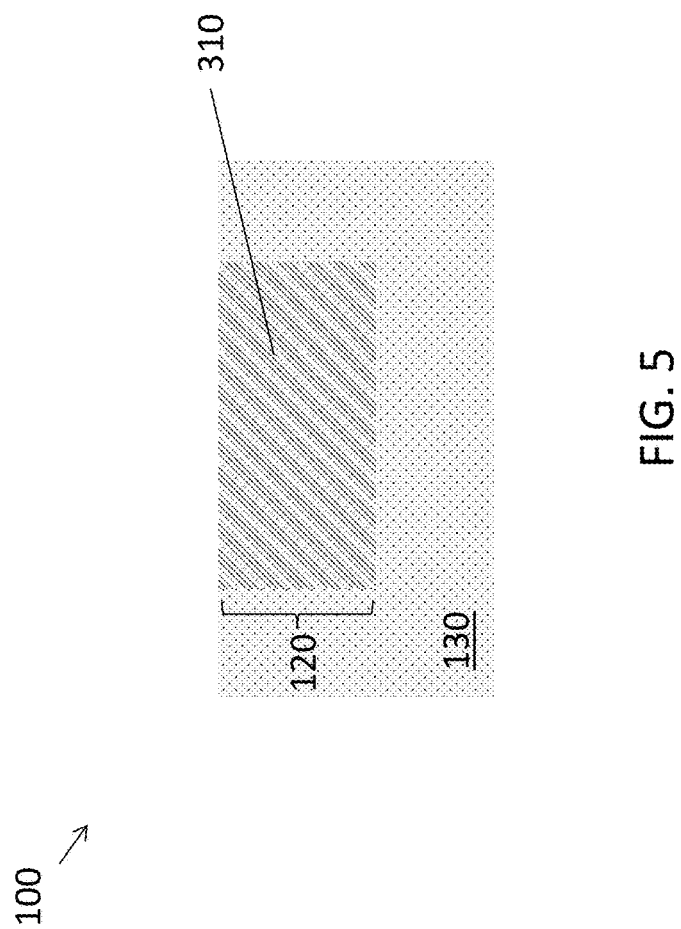
FIG. 5 is a cross sectional view of the metal interconnect layer according to embodiments of the invention.

FIG. 4 is a cross sectional view of a structure at another stage 400 in the formation of the metal interconnect layer 100 according to embodiments of the invention. A metal passivation layer 110 is used to passivate the overburden region 125 surface of the metal 310. The metal passivation layer 110 may include cobalt (Co), ruthenium (Ru), tantalum (Ta), titanium (Ti), nickel (Ni), or tungsten (W) or any alloy of Co, Ru, Ta, Ti, Ni, or W, or nitrides of Co, Ru, Ti, Ni, or W, or any combination. The metal passivation layer 110 restricts Cu surface diffusion at the surface of the overburden region 125 and reduces or eliminates the stress gradient between the overburden region 125 and lower metal region 120 that could result in voids in the embedded metal region 120. The resulting structure 400 is annealed in an anneal chamber 410 at a temperature up to 250° C. Generally, the anneal temperature is greater than 100° C. to promote grain growth but less than 300° C. During the annealing, the flow rate of ambient gas 420 into the chamber 410 is controlled to affect the resultant microstructure of the metal interconnect layer 100. The gas 420 may be hydrogen ($H_2$), Argon (Ar), or Nitrogen ($N_2$), for example. According to one embodiment, the gas 420 is 5% $H_2$. FIG. 5 is a cross sectional view of the metal interconnect layer 100 according to embodiments of the invention. A chemical-mechanical planarization (CMP) is used to remove the metal passivation layer 110 and overburden region 125 of the metal 310. The resulting metal interconnect layer 100 includes the dielectric 130 and metal 310 (in the embedded region 120) with a microstructure that includes greater than 50% twin boundaries 610 (FIG. 6).

Figure 6:
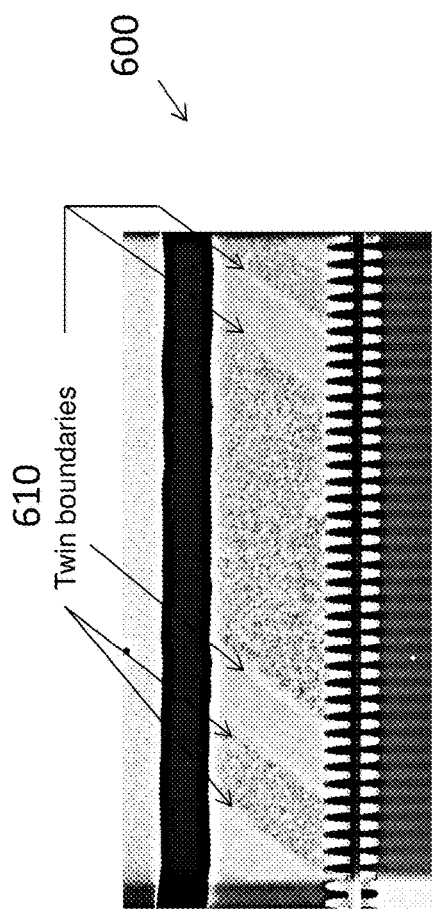
FIG. 6 illustrates the microstructure of the overburden region according to an embodiment of the invention.

FIG. 6 illustrates the microstructure 600 of the overburden region 125 according to an embodiment of the invention. FIG. 6 shows that, based on the metal passivation layer 110 being disposed over the metal 310 prior to annealing and based on controlling the anneal process, the microstructure 600 of the overburden region 125 includes grain boundaries that are more than 50% twin boundaries 610 between grains.

In terms of process flow, the microstructure 600 results from the anneal discussed with reference to FIG. 4 and the overburden region 125 (shown in FIG. 6) is then removed via CMP to obtain the final metal interconnect layer 100 shown in FIG. 5. The overburden region 125 (although removed to obtain the metal interconnect layer 100) including over 50% twin boundaries 610 based on the process described above (passivation layer 110, anneal temperature and gas flow rate control) is significant to the microstructure of the metal 310 in the embedded metal region 120. That is, the grain growth path is from the overburden region 125 to the embedded metal region 120 such that the twin boundaries 610 generated in the overburden region 125 by embodiments of the process described herein go into the embedded metal region 120 and affect the electrical conductivity and mechanical strength of the resulting metal interconnect layer 100. FIG. 6 is a cross-sectional view of the overburden region 125. As noted above, the previously used TaN passivation layer prior to anneal results in relatively smaller grains in the patterned features of the embedded metal layer 120 (greater than 10% but less than 50% twin boundaries 610, generally). Passivation with the metal passivation layer 110 according to embodiments discussed herein results in larger grain size and more than 50% twin boundaries 610 between grains. As noted above, the ideal microstructure for the metal interconnect layer 100 is a single grain rather than a polycrystalline structure. The twin boundaries 610 in the microstructure 600 (and, consequently, in the microstructure of the embedded metal region 120) according to the embodiments discussed herein facilitate the microstructure of the metal interconnect layer 100 being analogous to that of a single grain for the purposes of electrical conductivity and mechanical strength.

Figure 7:
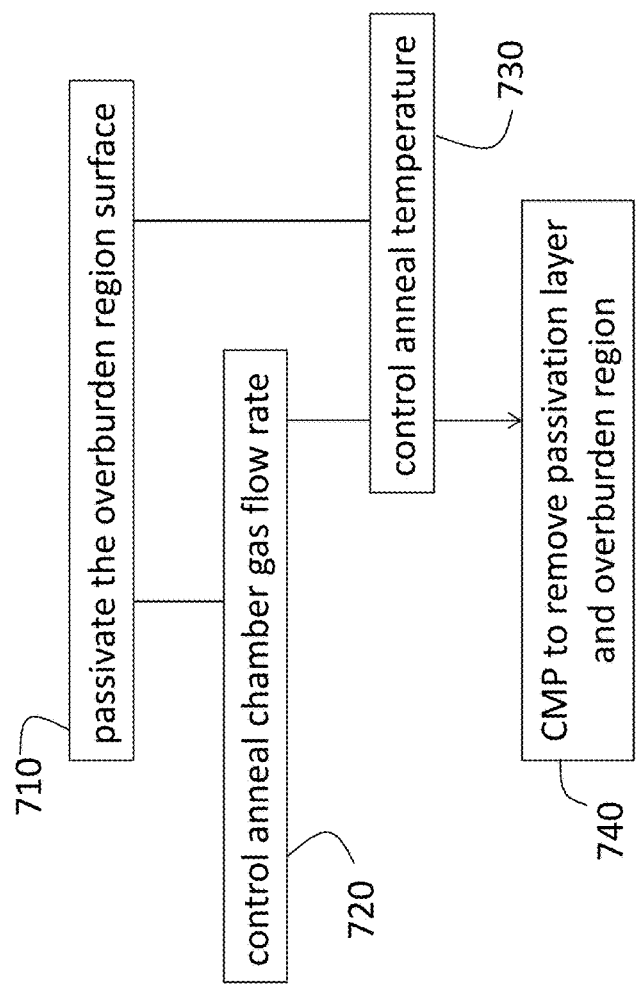
FIG. 7 is a process flow of a method of fabricating a metal interconnect layer according to embodiments of the invention.

FIG. 7 is a process flow of a method of fabricating a metal interconnect layer 100 according to embodiments of the invention. At block 710, passivating the overburden region 125 surface of the metal 310 includes disposing the metal passivation layer 110. As noted above, metal passivation layer 110 may include Co, Ru, Ta, Ti, Ni, or W or any alloy of Co, Ru, Ta, Ti, Ni, or W, or nitrides of Co, Ru, Ti, Ni, or W. The metal passivation layer 110 may include any combination of these. At block 720, controlling the anneal chamber 410 gas 420 flow rate may be done to additionally control the microstructure 600 of the overburden region 125 and the imbedded metal region 120. Controlling the anneal temperature at block 420 for a specified period of time, which may be determined based on experimentation or computation, results in the microstructure 600 of the overburden region 125 as shown in FIG. 6. As FIG. 6 indicates, over 50% twin boundaries 610 are present in the microstructure 600 of the overburden region 125. Consequently, over 50% of grain boundaries in the embedded metal region 120 are twin boundaries 610 such that the electrical conductivity and mechanical strength of the embedded metal region 120 in the metal interconnect layer 100, according to embodiments discussed herein, is relatively closer to the electrical conductivity and mechanical strength for a single grain rather than a polycrystalline structure. At block 740, performing CMP to remove the metal passivation layer 110 and overburden region 125 results in the metal interconnect layer 100 that includes the embedded metal region 120 with over 50% of grain boundaries being twin boundaries 610.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a metal interconnect layer, the method comprising:
    forming an opening in a dielectric layer;
        forming an embedded metal layer fully filled in the opening, wherein the embedded metal layer is in direct contact with a bottom surface of the dielectric layer;
        forming an overburden layer over a top surface of the embedded metal layer and the dielectric layer;
        disposing a metal passivation layer in direct contact with a surface of the overburden layer, the metal passivation layer comprising a metal selected only from a group of: cobalt (Co), ruthenium (Ru), tantalum (Ta), titanium (Ti), nickel (Ni), tungsten (W), any alloy including only Co, Ru, Ti, or W thereof, nitrides of only Co, Ru, Ti, Ni, or W, and any combination thereof;
    performing an anneal at a temperature exceeding 100 degrees centigrade and below 300 degrees centigrade; and
    performing a chemical-mechanical planarization (CMP) to remove the metal passivation layer and the overburden layer.

2. The method according to claim 1, wherein the performing the anneal includes annealing in an anneal chamber.

3. The method according to claim 2, further comprising controlling a flow rate of a gas into the anneal chamber.

4. The method according to claim 3, wherein the controlling the flow rate of the gas includes controlling the flow rate of one of hydrogen, argon, or nitrogen gas.

5. The method according to claim 3, wherein the controlling the flow rate of gas includes controlling the flow rate of 5% hydrogen gas.

6. A method of forming a device that includes a metal interconnect layer, the method comprising:
    disposing a metal passivation layer in direct contact with an overburden region of a metal layer that is fully disposed in an opening of a dielectric layer and above the dielectric layer and in direct contact with a bottom surface of the dielectric layer, the metal passivation layer comprising a metal selected only from a group of: cobalt (Co), ruthenium (Ru), tantalum (Ta), titanium (Ti), nickel (Ni), tungsten (W), any alloy including only Co, Ru, Ti, or W thereof, nitrides of only Co, Ru, Ti, Ni, or W, and any combination thereof;
    performing an anneal at a temperature exceeding 100 degrees centigrade and below 300 degrees centigrade;
    performing a chemical-mechanical planarization (CMP) to remove the metal passivation layer and the overburden region of the metal layer; and
    interconnecting two components of the device with the metal interconnect layer based on disposing each of the two components at opposite ends of the metal interconnect layer.

7. The method according to claim 6, wherein the performing the anneal is in an anneal chamber.

8. The method according to claim 7, further comprising controlling a flow rate of a gas into the anneal chamber.

9. The method according to claim 8, wherein the controlling the flow rate of the gas includes controlling the flow rate of one of hydrogen, argon, or nitrogen gas.

10. The method according to claim 8, wherein the controlling the flow rate of the gas includes controlling the flow rate of 5% hydrogen gas.

11. The method according to claim 6, wherein the disposing the metal passivation layer on the metal interconnect layer includes disposing the metal passivation layer on a surface of the overburden region of the metal interconnect layer.

* * * * *